United States Patent
Paramasivam et al.

(10) Patent No.: US 8,165,837 B1
(45) Date of Patent: Apr. 24, 2012

(54) MULTI-SCALE CLASSIFICATION OF DEFECTS

(75) Inventors: Saravanan Paramasivam, Rajakilpakkam (IN); Patrick Y. Huet, San Jose, CA (US); Martin Plihal, Pleasanton, CA (US); Luc Debarge, Dresden (DE)

(73) Assignee: KLA-Tencor Corporation, Milpitas, CA (US)

( * ) Notice: Subject to any disclaimer, the term of this patent is extended or adjusted under 35 U.S.C. 154(b) by 418 days.

(21) Appl. No.: 12/478,844

(22) Filed: Jun. 5, 2009

Related U.S. Application Data

(60) Provisional application No. 61/059,973, filed on Jun. 9, 2008.

(51) Int. Cl.
*G01N 37/00* (2006.01)
(52) U.S. Cl. .......................................... 702/82; 702/83
(58) Field of Classification Search .............. 702/81–84, 702/117, 118; 700/108–110, 121; 382/145, 382/148, 149
See application file for complete search history.

(56) References Cited

U.S. PATENT DOCUMENTS

| | | | | |
|---|---|---|---|---|
| 5,240,866 A | * | 8/1993 | Friedman et al. | 702/35 |
| 5,991,699 A | * | 11/1999 | Kulkarni et al. | 702/83 |
| 2004/0064269 A1 | * | 4/2004 | Shibuya et al. | 702/40 |

* cited by examiner

*Primary Examiner* — Manuel L Barbee
(74) *Attorney, Agent, or Firm* — Luedeka Neely Group, P.C.

(57) ABSTRACT

A computerized method for categorizing defects on a substrate. A list of defects on the substrate is received as input to a processor, where each defect is represented by a defect location and an associated micro-defect code. The input is analyzed with the processor to detect spatial clusters of defects on the substrate. The spatial clusters are analyzed with the processor to determine which of the spatial clusters represent known macro-defects and which of the spatial clusters represent unknown macro-defects. The micro-defect code associated with each defect that is included in one of the spatial clusters that is determined to be a known macro-defect is changed with the processor with a macro-defect code that is associated solely with the known macro-defect. The processor analyzes the defects that are included in one of the spatial clusters that is determined to be an unknown macro-defect to determine a predominantly occurring micro-defect code. The processor changes the micro-defect code associated with each defect that is included in the one spatial cluster that is determined to be an unknown macro-defect with the predominantly-occurring micro-defect code. The processor sends the changed list of defects on the substrate as output.

6 Claims, 1 Drawing Sheet

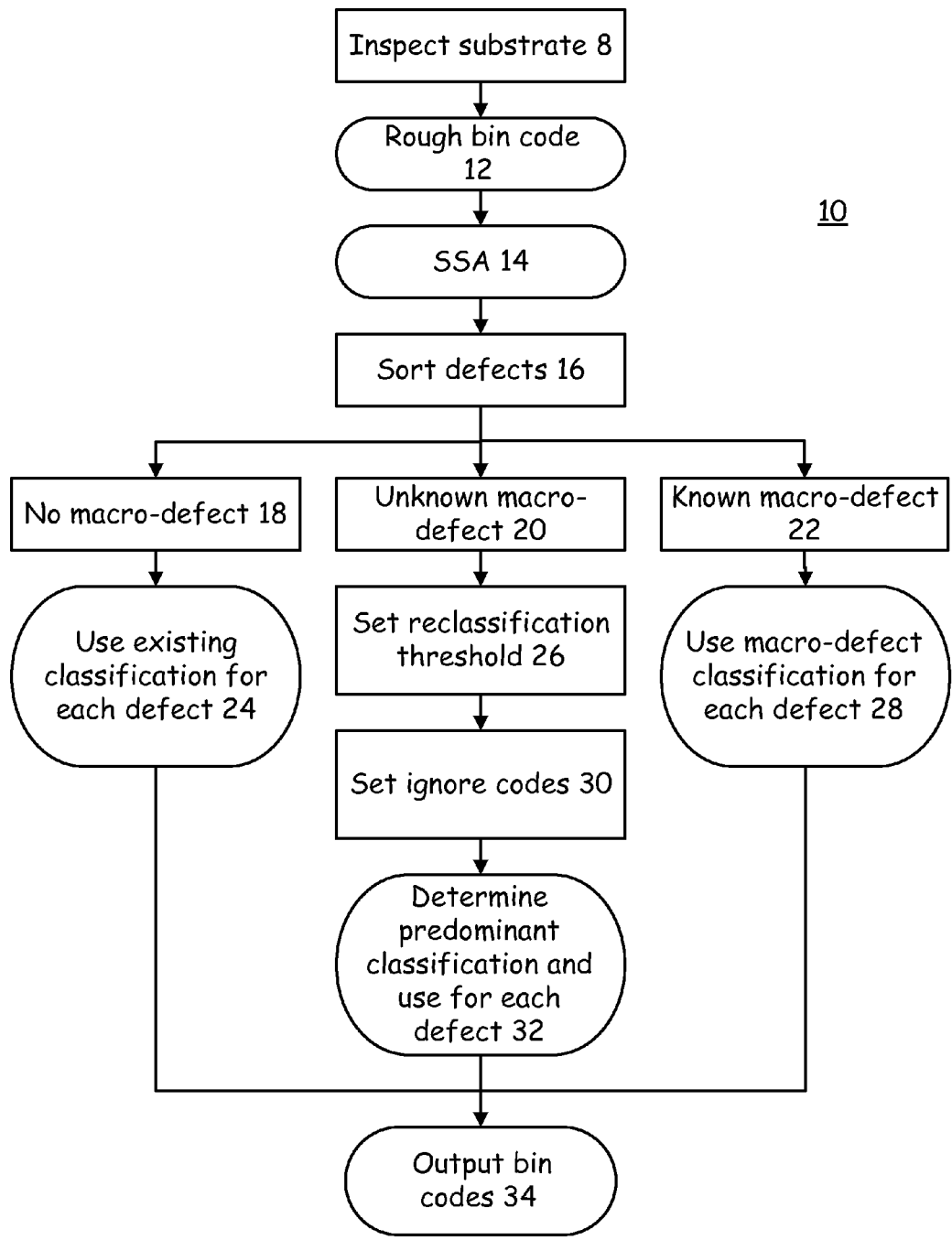

MULTI-SCALE CLASSIFICATION OF DEFECTS

This application claims all rights and priority on U.S. provisional application 61/059,973 filed 2008.06.09, the entire disclosure of which is incorporated herein by reference. This invention relates to the field of integrated circuit fabrication. More particularly, this invention relates to inspection of integrated circuits and the detection and analysis of the defect information generated thereby.

FIELD

Background

During integrated circuit fabrication processes, the integrated circuits typically receive a variety of different inspections, such as optical inspections. As the term is used herein, "integrated circuit" includes devices such as those formed on monolithic semiconducting substrates, such as those formed of group IV materials like silicon or germanium, or group III-V compounds like gallium arsenide, or mixtures of such materials. The term includes all types of devices formed, such as memory and logic, and all designs of such devices, such as MOS and bipolar. The term also comprehends applications such as flat panel displays, solar cells, and charge coupled devices.

Inspection tools are designed and optimized for detecting defects with sizes comparable with the feature sizes of the integrated circuit. This leads to constraints on the tool, which limit the maximum size of a defect that the tool can detect as a single defect. Because of this size limitation, defects that are larger than this, referred to as macro-defects herein, are reported as a collection of smaller defects—up to several thousands of such. It is thus necessary to analyze the collective properties of the defect population on the substrate or die level, in order to identify these large defects as a single failure. As used herein, the term "substrate" refers to the substrates on which the integrated circuits are fabricated, the masks or reticles from which the patterns used to form the integrated circuits are transferred, and other types of substrates as used in the integrated circuit fabrication industry.

Existing defect binning methods classify each detected defect as an individual entity and completely ignore the commonality of the defect distribution that represents these macro-defects. For example, a long scratch across a substrate might get classified as a thousand smaller defects, and the fact that a scratch exists across a substrate can be entirely missed. Worse, the thousand smaller defects that are erroneously detected pollute the defect bins into which they are placed, hiding other issues that might exist, or falsely flagging conditions that don't really exist.

Existing defect binning approaches classify either the defect image, the pattern context around the defect, or some other defect-level attribute, all of which are local properties of the reported defect. The local information may carry very little relationship with the actual defect, or may at least have a significant random component.

As a consequence, in the best case scenario, the corresponding classification is likely to have significant random component and a large statistical uncertainty in the binning outcome. This uncertainty, combined with the fact that macro-defects typically contribute large number of defects to the overall defect population, pollutes the overall classification results for micro defects (truly random defects) and has adverse effect on process control and sampling quality. This yields low-value inspection review results and a higher rate of false alarms in statistical process control charts.

Classification of micro-defects is generally performed using one or more of the following methods: (1) Image based classification that classifies defect image patches; (2) Rule based binning that classifies defects by using rules applied to defect-level attributes; (3) Design based binning that classifies defects from design clips extracted from the design layout based on the defect location in the die; and (4) Care area group code assignment analysis that classifies defects using a segmentation and classification of the die layout into logically/functionally equivalent regions, where, for example, region definition may come directly out of the design layout files. Defects are then correlated with the classified regions and assigned the code of the region they belong to.

Each of the classification methods introduced above has its strengths and weaknesses, and one may be favored over another in different cases. However, they all have the same limitation, in that they do not deal properly with large scale defectivity, simply because the input data contains incomplete information about the macro-defect. This has two negative consequences, as alluded to above: (1) The partial defect information fed into the classifier makes it unlikely that the defect type will be correctly determined; and (2) The independent classification of a large number of events typically associated with macro-defects is likely to pollute bins of the micro-defects on the substrate. If the ratio of the number of clustered defects to the random (micro) defects is large, then the pollution can significantly degrade the classifier performance, even if the classifier is very stable and has a high accuracy and purity.

What is needed, therefore, is a system that overcomes problems such as those described above, at least in part.

SUMMARY

The above and other needs are met by a computerized method for categorizing defects on a substrate. A list of defects on the substrate is received as input to a processor, where each defect is represented by a defect location and an associated micro-defect code. The input is analyzed with the processor to detect spatial clusters of defects on the substrate. The spatial clusters are analyzed with the processor to determine which of the spatial clusters represent known macro-defects and which of the spatial clusters represent unknown macro-defects. The micro-defect code associated with each defect that is included in one of the spatial clusters that is determined to be a known macro-defect is changed with the processor with a macro-defect code that is associated solely with the known macro-defect. The processor analyzes the defects that are included in one of the spatial clusters that is determined to be an unknown macro-defect to determine a predominantly occurring micro-defect code. The processor changes the micro-defect code associated with each defect that is included in the one spatial cluster that is determined to be an unknown macro-defect with the predominantly-occurring micro-defect code. The processor sends the changed list of defects on the substrate as output.

In this manner, the micro-defect codes that are associated with defects that belong to macro-defects are reclassified with codes that indicate that they are macro-defects and not just micro-defects. This removes the defects that are associated with macro-defects from the bin counts of micro-codes that are not associated with macro-defects, and enables an unconfounded analysis of those defects that truly are randomly occurring, and are properly categorized as micro-defects.

In some embodiments the step of analyzing with the processor the defects that are included in one of the spatial clusters that is determined to be an unknown macro-defect comprises analyzing the included defects with the processor to determine whether they meet a user-specified reclassification threshold, and if they do not, then not changing with the processor the micro-defect code of those included defects.

In some embodiments the step of analyzing with the processor the defects that are included in one of the spatial clusters that is determined to be an unknown macro-defect comprises analyzing the included defects with the processor to determine whether they have a micro-defect code that is included in a user-specified list of ignore codes, and if they do, then not changing with the processor the micro-defect code of those included defects.

BRIEF DESCRIPTION OF THE DRAWINGS

Further advantages of the invention are apparent by reference to the detailed description when considered in conjunction with the figure, which is not to scale so as to more clearly show the details, wherein like reference numbers indicate like elements, and which depicts a method according to an embodiment of the present invention.

DETAILED DESCRIPTION

One benefit of the various embodiments according to the present invention is an increase in the accuracy and purity of the classification of micro-defects detected by an inspection tool, by using a method that combines information about defectivity on different scales (micro and macro).

The proposed methods take advantage of: (1) correlations in defect distribution on the substrate to identify macro-defect groupings, and (2) various binning schemes that classify individual defects. The various methods combine these two pieces of information into a new classification scheme by: (1) retaining the defect level classification for micro-defects, and (2) reclassifying the defects within the macro-defect with a unique code and removing them from the micro-defect bins, as described in more detail below.

A reclassification engine according to one embodiment of the present invention performs the following three tasks: (1) It takes for input both (a) the output of a user-selected defect grouping analysis (macro-defect), and (2) the output of a user-selected micro-defect classification; (2) It retains the classification of defects that are not a part of the macro-defect population; (3) It performs a reclassification of the defects that are identified as being part of a macro-defect, where the reclassification is based on a user-defined specification and a statistical analysis of the class code distribution within each macro-defect.

The operation of the multi-scale classifier includes the following steps. First, the data in regard to the micro-defect analysis is accepted into the classifier. This data might include some macro-defect information, but it might not. Second, the data is analyzed to determine macro-defects. If macro-defects have already been determined using a different process, then this second step is optional. Third, the micro-defects that are associated with macro-defects are recoded using a special code that identifies them as being a part of a given macro-defect. This step removes those micro-defects from those classifications in which just micro-defects are to be classified, and places those micro-defects that are a part of macro-defects into classifications that are solely for macro-defects. Thus, the defects that remain binned into the micro-defect classifications are only micro-defects and do not belong to any macro-defect classifications. This makes the binning of the micro-defect classifications "pure" and enables a more reasoned analysis of the micro-defect classifications, which are free from the confounding influences of the macro-defects.

Thus, the multi-scale classifier according to the embodiments of the present invention works with pre-calculated defect classification and with properties of the defect distribution. It requires minimum setup, whose purpose is to select the desired input attributes and decide between few rules. It can be implemented with existing classification routines, to remove the confounding influence of the macro-defects that are still binned into micro-defect classifications. In some embodiments the multi-scale classifier is implemented with its own classification routines, and sorts through the raw data looking for macro-defects, without the need for an earlier routine to identify macro-defects.

Execution of the method of some embodiments is inserted into the substrate post-processing flow, following micro-defect classification and defect grouping analysis, and preceding any sampling scheme. In other embodiments, the arbitration between the macro-defect and the micro-defect information is performed in off-line analysis software. However, performing this arbitration off-tool takes away the advantage of being able to perform on-tool sampling and image-grab based on the improved classification results.

Spatial signature analysis is the most refined substrate-level analysis, and provides classification of defect groupings based on the pattern that they form on the substrate. Typical setup of the multi-scale classifier for spatial signature analysis is accomplished by accepting the spatial signature analysis classification for defect signatures of characteristic pattern, and ignoring the micro-defect level classification for those defects. The spatial signature analysis grouping information is used for signatures of unknown patterns. All the defects in those signature class codes are reclassified with the code that coincides with the majority type in the signatures. The defect-level classification for un-grouped (un-clustered) defects is accepted by the system.

In another embodiment, the received clustering information is used to separate the defects into a random population (micro-defects) and a clustered population (macro-defects). The defect-level classification for the random defects is accepted. For each defect binned in a cluster, the predominantly occurring class code for the defects in the cluster is determined and applied to all of the defects in the cluster.

One of the advantages of the multi-scale classifier according to the present invention is that the reclassification of micro-defects using identified macro-defect populations removes a large source of misclassification. Further, it improves the accuracy of defect-level classifiers by choosing the majority classification result for a given macro-defect population. This makes sense for reticle repeaters where all of the defects are most likely of the same type, as well as for a large number of clusters that are the result of a common process excursion. In cases where the macro-defect analysis identifies characteristic and classifiable patterns (such as scratches, chemical-mechanical polishing arcs, lines, and so forth), the classification is further improved by assigning this known type to all of the defects in the signatures. The different aspects of the invention result in better defect sampling for SEM review, more accurate and reliable statistical process control excursion monitoring.

With reference now to the figure, there is described a representative embodiment of a method 10 according to the present invention. An optical inspection of the substrate is performed as given in block 8. The data generated by the inspection is analyzed to detect defects, which are assigned a bin code as given in block 12. This bin code represents the type of micro-defect associated with the defect that has been detected on the substrate. Some type of cluster analysis is performed on the defect information, such as spatial signature analysis, as given in block 14. This cluster analysis detects macro-defects on the substrate, such as scratches, rings, arcs, and other known and unknown clusters of defects.

The defects are then sorted, as given in block 16, according to whether they are not included in any macro-defect, as given in block 18, whether they fall into a category with some unknown macro-defect (cluster), as given in block 20, or whether they fall into a category with some known macro-defect (cluster), as given in block 22. This information is derived from the cluster information, as determined in block 14.

The defects that are not considered to be associated with any macro-defect retain their existing micro-defect classification, as given in block 24. These defects are considered to be the truly randomly-occurring defects, and are not a part of a scratch or a ring, for example. These are binned as micro-defects and not as any type of macro-defect. Thus, they are output with their original micro-defect code, as given in block 34.

The defects that are associated with known macro-defects, such as a scratch or are for example, are reclassified with a binning code that is associated with the macro-defect. Thus, whatever micro-defect binning code they might have received in block 12 is removed, and the defect is reassigned a macro-defect code. Thus, the reassigned defect is removed from the original micro-defect bin, because it is not a truly randomly-occurring defect. Rather, it is part of some type of macro-defect that is known. By outputting the defect in block 34 with a new macro-defect code, the micro-defect bins remain with only truly randomly-occurring defects binned within them.

In some instances, the cluster analysis process 12 or the defect sorting process 16 as appropriate identifies a cluster of defects with properties that don't match any of the known clusters (macro-defects). These defects are identified as being a part of an unknown macro-defect, as given in block 20. A confidence threshold can be applied to these defects, as given in block 26, to determine whether they really are a part of an unknown cluster, or whether they should be treated as random defects as given in block 18.

If the defects pass the reclassification threshold 26, then they are analyzed to determine whether they have been assigned micro-defect codes in block 12 of a type that should be ignored, as indicated in block 30. Such ignore codes could be specified by a user, for example. If they have micro-defect codes that should be ignored as a cluster for some reason, then the defects are processed as truly random defects, as described in regard to block 18.

However, if the defects pass the screens 26 and 30 as described above, the micro-defect codes for this unknown cluster of defects are analyzed as given in block 32 to determine the micro-defect code that is most predominantly associated with the defects within the cluster. Once this predominant micro-defect code is determined, then all of the defects within the unknown cluster are reassigned to this micro-defect classification, and the values are output as given in block 34.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A computerized method for categorizing defects on a substrate, the method comprising the steps of:
   receiving as input to a processor a list of defects on the substrate, where each defect is represented by a defect location and an associated micro-defect code,
   analyzing the input with the processor to detect spatial clusters of defects on the substrate,
   analyzing the spatial clusters with the processor to determine which of the spatial clusters represent known macro-defects and which of the spatial clusters represent unknown macro-defects,
   for each defect that is included in one of the spatial clusters that is determined to be a known macro-defect, changing with the processor the micro-defect code associated with the defect to a macro-defect code that is associated solely with the known macro-defect,
   analyzing with the processor the defects that are included in one of the spatial clusters that is determined to be an unknown macro-defect to determine a predominantly occurring micro-defect code, and
   for each defect that is included in the one spatial cluster that is determined to be an unknown macro-defect, changing with the processor the micro-defect code associated with the defect to the predominantly-occurring micro-defect code, and
   sending as output from the processor the changed list of defects on the substrate.

2. The method of claim 1, wherein the step of analyzing with the processor the defects that are included in one of the spatial clusters that is determined to be an unknown macro-defect comprises analyzing the included defects with the processor to determine whether they meet a user-specified reclassification threshold, and if they do not, then not changing with the processor the micro-defect code of those included defects.

3. The method of claim 1, wherein the step of analyzing with the processor the defects that are included in one of the spatial clusters that is determined to be an unknown macro-defect comprises analyzing the included defects with the processor to determine whether they have a micro-defect code that is included in a user-specified list of ignore codes, and if they do, then not changing with the processor the micro-defect code of those included defects.

4. A computerized method for inspecting a substrate, the method comprising the steps of:
   scanning the substrate with an optical sensor to detect defects,
   storing a defect location and an associated micro-defect code for each defect,
   receiving as input to a processor a list of defects on the substrate, where each defect is represented by a defect location and an associated micro-defect code,
   analyzing the input with the processor to detect spatial clusters of defects on the substrate, analyzing the spatial clusters with the processor to determine which of the spatial clusters represent known macro-defects and which of the spatial clusters represent unknown macro-defects, for each defect that is included in one of the spatial clusters that is determined to be a known macro-defect, changing with the processor the micro-defect code associated with the defect to a macro-defect code that is associated solely with the known macro-defect, analyzing with the processor the defects that are included in one of the spatial clusters that is determined to be an unknown macro-defect to determine a predominantly occurring micro-defect code, and for each defect that is included in the one spatial cluster that is determined to be an unknown macro-defect, changing with the processor the micro-defect code associated with the defect to the predominantly-occurring micro-defect code, and sending as output from the processor the changed list of defects on the substrate.

5. The method of claim 4, wherein the step of analyzing with the processor the defects that are included in one of the spatial clusters that is determined to be an unknown macro-defect comprises analyzing the included defects with the processor to determine whether they meet a user-specified reclassification threshold, and if they do not, then not changing with the processor the micro-defect code of those included defects.

6. The method of claim 4, wherein the step of analyzing with the processor the defects that are included in one of the spatial clusters that is determined to be an unknown macro-defect comprises analyzing the included defects with the processor to determine whether they have a micro-defect code that is included in a user-specified list of ignore codes, and if they do, then not changing with the processor the micro-defect code of those included defects.

* * * * *